United States Patent [19]

Isaki

[11] Patent Number: 5,216,904
[45] Date of Patent: Jun. 8, 1993

[54] HANDLE DEVICE HAVING A LOCK MECHANISM FOR AN AUDIO EQUIPMENT

[75] Inventor: Mikio Isaki, Saitama, Japan

[73] Assignee: Pioneer Electronic Corporation, Tokyo, Japan

[21] Appl. No.: 744,723

[22] Filed: Aug. 14, 1991

[30] Foreign Application Priority Data

Nov. 6, 1990 [JP] Japan ............... 2-116360[U]
Nov. 6, 1990 [JP] Japan ............... 2-116361[U]
Nov. 6, 1990 [JP] Japan ............... 2-116362[U]

[51] Int. Cl.⁵ ............ E05B 69/00; A47B 95/02; H04B 1/08
[52] U.S. Cl. .................... 70/58; 16/126; 455/348
[58] Field of Search ............. 16/126, 115; 455/346, 455/348; 361/391; 292/227, DIG. 49; 70/57, 58

[56] References Cited

U.S. PATENT DOCUMENTS

| | | | |
|---|---|---|---|
| 2,944,864 | 7/1960 | Krivulka | 361/391 |
| 4,658,439 | 4/1987 | Danielsen et al. | 455/348 |
| 4,829,595 | 5/1989 | Kobayashi et al. | 455/346 |
| 4,947,661 | 8/1990 | Yoshida | 70/57 |
| 5,020,151 | 5/1991 | Sampei et al. | 455/348 |
| 5,152,496 | 10/1992 | Kobayashi | 70/58 |

Primary Examiner—John Sipos
Assistant Examiner—Carmine Cuda
Attorney, Agent, or Firm—Nikaido, Marmelstein, Murray & Oram

[57] ABSTRACT

An engaging plate is provided on a handle, and a lock lever is provided to be engaged with a hook of the engaging plate. A spring is provided to urge the lock lever so as to engage the lock lever with the hook to lock the handle. The handle is released by a slide plate provided to be engaged with the lock lever. A pushbutton is fixed to the slide plate for pushing the slide plate. When the slide plate is pushed, the lock lever is rotated to release the lock lever from the hook.

9 Claims, 7 Drawing Sheets

PRIOR ART

HANDLE DEVICE HAVING A LOCK MECHANISM FOR AN AUDIO EQUIPMENT

BACKGROUND OF THE INVENTION

The present invention relates to a handle device for an audio equipment such as a car stereo or a portable stereo, and more particularly to a handle device having a lock mechanism for an audio equipment mounted on a vehicle.

The car stereo is mounted in a dashboard of the motor vehicle. The process for mounting the car stereo in the dashboard is a very troublesome work, so that it takes a long time with labor to attach the car stereo.

On the other hand, in order to prevent the stealing of the car stereo, there has been provided a car stereo which is detachably mounted in a holder secured to the dashboard so that the car stereo can be taken out by the user.

Figure 8:
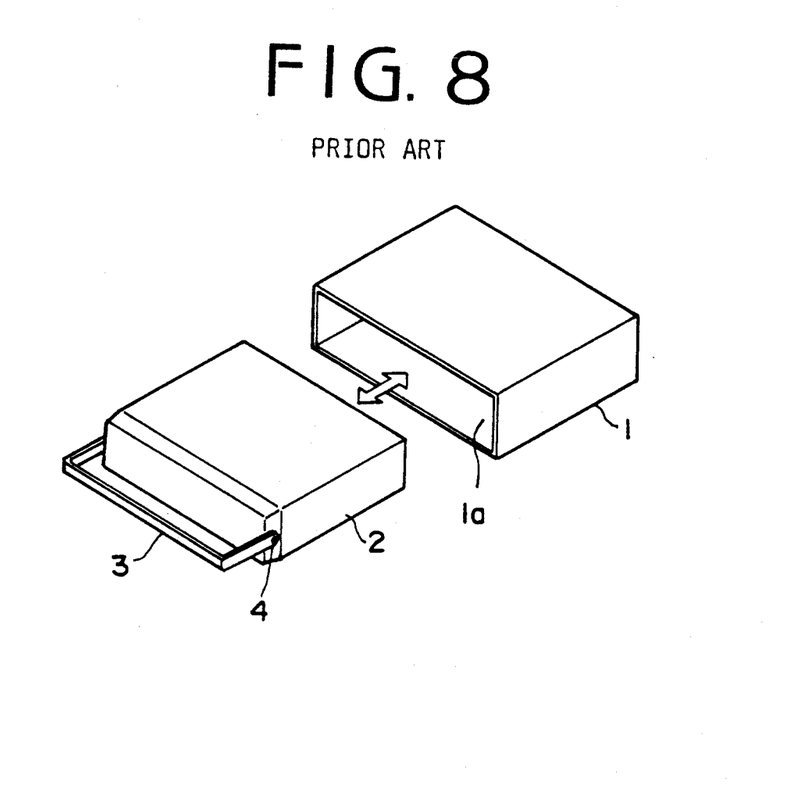
FIG. 8 is a schematic perspective view showing a conventional car stereo.

FIG. 8 shows a conventional detachable car stereo. A holder 1 having an opening 1a is secured to a dashboard of a motor vehicle (not shown). A body of a car stereo 2 having a handle 3 is detachably mounted in the holder 1 passing through the opening 1a. The handle 3 is rotatably mounted on the car stereo 2 by screws 4.

The car stereo body 2 is pushed in the holder 1 and pulled out from the holder 1 by the handle 3 as shown by arrows.

Figure 9:
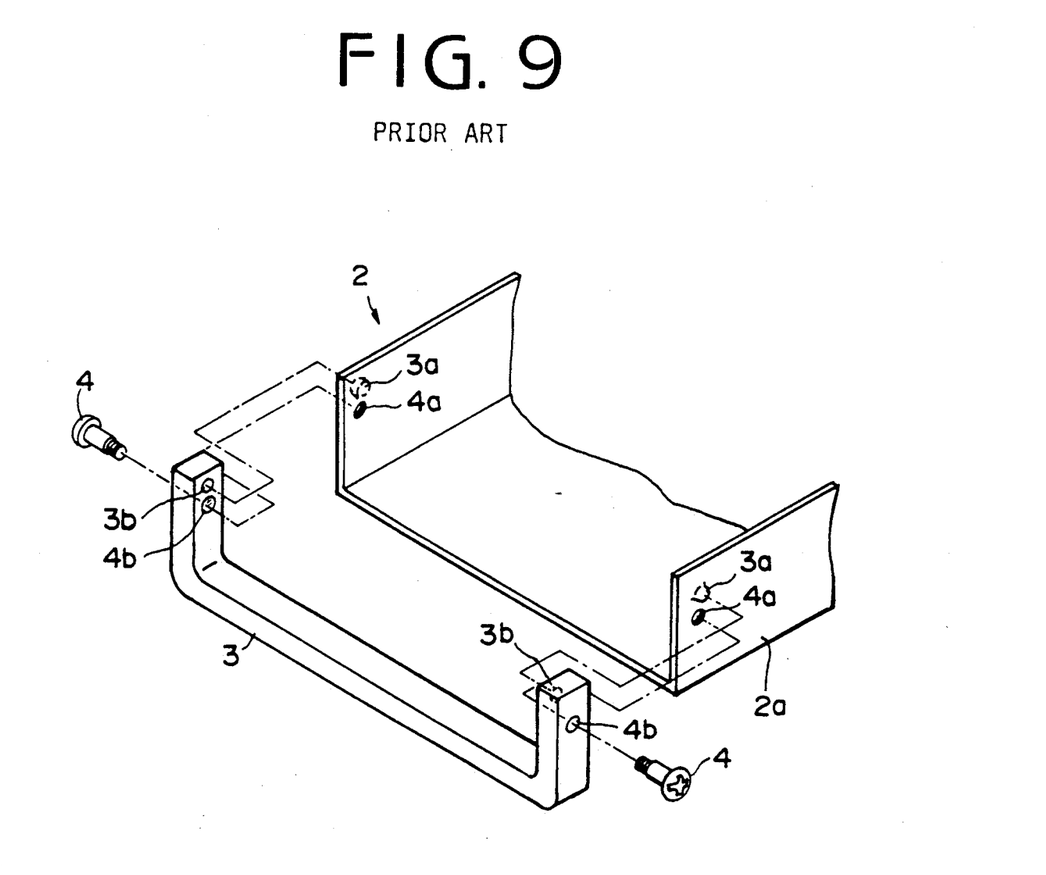
FIG. 9 is a perspective view showing a lock device for the conventional car stereo.

FIG. 9 shows a lock device of the handle 3. The handle 3 is provided with a hole 4b for the screw 4 and a recess 3b formed on an upper portion of the hole 4. The car stereo body 2 is provided with a threaded hole 4a formed in a side plate 2a thereof for the screw 4 corresponding to the hole 4b of the handle 3, and a projection 3a outwardly projected from the upper portion of the hole 4a corresponding to the recess 3b of the handle 3.

When the car stereo body 2 is mounted in the holder 1, the handle 3 is set on a predetermined receiving position, where the projection 3a engages with the recess 3b. Thus, the handle 3 is locked.

In order to take out the car stereo body 2 from the holder 1, the handle 3 is pivoted in the opposite direction by fingernails of the user to disengage the projections 3a from the recesses 3b, and then, the stereo is pulled out.

However, in the conventional device, the projections 3a engages with the recess 3b without a click. Consequently, operation feeling is bad. Further, it is difficult to pull out the handle 3 from the retracted position by the fingernails.

Figure 10:
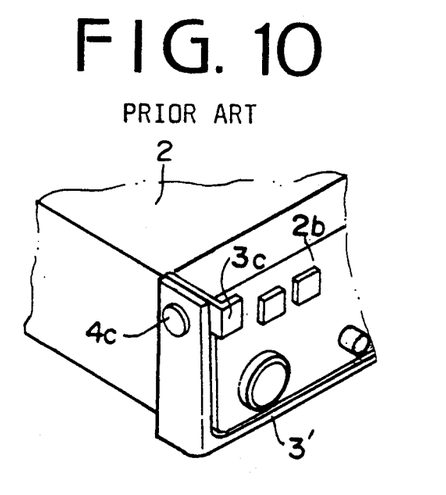
FIG. 10 is a perspective view showing another example of the conventional detachable car stereo.

FIG. 10 shows another example of the conventional detachable car stereo in which 1 push arm 3c is provided for pulling a handle 3'. The handle 3' is rotatably mounted on the body 2 of the car stereo at the opposite side portions of an operation panel 2b by shafts 4c. The push arm 3c is adapted to forwardly rotate the handle 3' when the push arm 3c is compressed toward the body 2.

However, since the push arm 3c is provided near the shaft 4c, a large force is required to push the arm 3c. Furthermore, the handle 3' and the push arm 3c are made of metal plate so that it is inharmonious with the operation panel 2b made of plastic. Therefore, the appearance of the operation panel 2b is bad.

Figure 11:
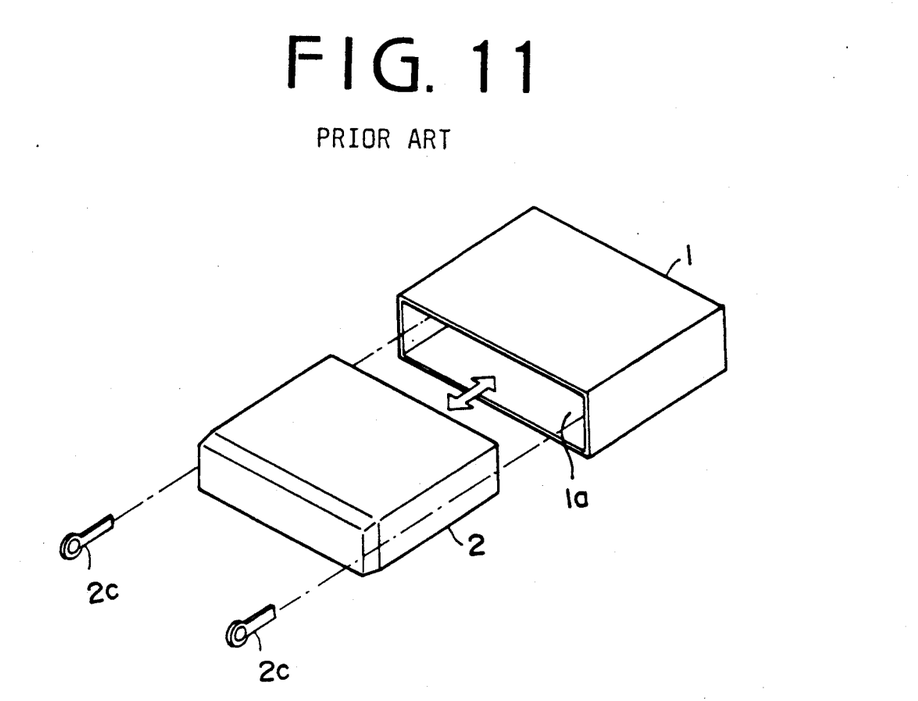
FIG. 11 is a perspective view showing a further example of the conventional detachable car stereo.

FIG. 11 shows a further example of the conventional detachable car stereo without a handle.

A car stereo body 2' has engaging members (not shown) provided on the opposite side portions thereof. When the body 2' is mounted in the holder 1, the engaging members engage with the holder 1. A pair of release tools 2c are provided for removing the car stereo 2' from the holder 1. The engaging members are moved by the release tools 2c to release the engagement. Thus, the car stereo 2' can be pulled out from the holder 1.

SUMMARY OF THE INVENTION

An object of the present invention is to provide a handle device having a lock mechanism for a car stereo which may be improved in appearance of the car stereo and in operability of the lock mechanism.

Another object of the present invention is to provide a lock mechanism which may be manufactured at a low cost.

According to the present invention, there is provided a handle device for an audio equipment provided in a housing comprising a holder in which the housing is to be inserted, a handle having a flat U-shape and pivotally mounted on the housing, an engaging plate provided on the handle and having a hook, a first lock lever pivotally mounted on the housing and having an engaging lug provided to be engaged with the hook of the engaging plate, a spring provided to urge the first lock lever so as to engage the engaging lug with the hook to lock the handle, a slide plate slidably mounted in the housing and having a lug to be engaged with the first lock lever.

A pushbutton is fixed to the slide plate for pushing the slide plate, whereby the lug is engaged with the first lock lever to rotate it so as to release the engaging lug from the hook.

In an aspect of the invention, a second lock lever is provided to be pivoted by a tool for locking and releasing the slide plate.

The other objects and features of this invention will become understood from the following description with reference to the accompanying drawings.

DETAILED DESCRIPTION OF THE PREFERRED EMBODIMENTS

Figure 1:
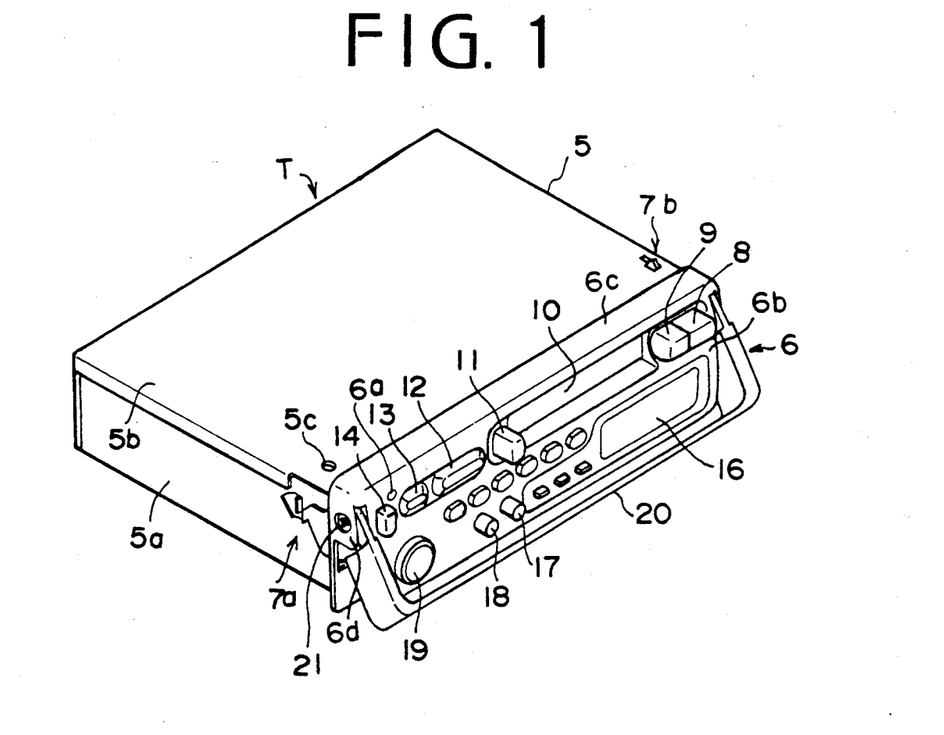
FIGS. 1 and 2 are perspective views showing a radio cassette for a motor vehicle in which a handle having lock mechanism according to the present invention is used.
Figure 2:
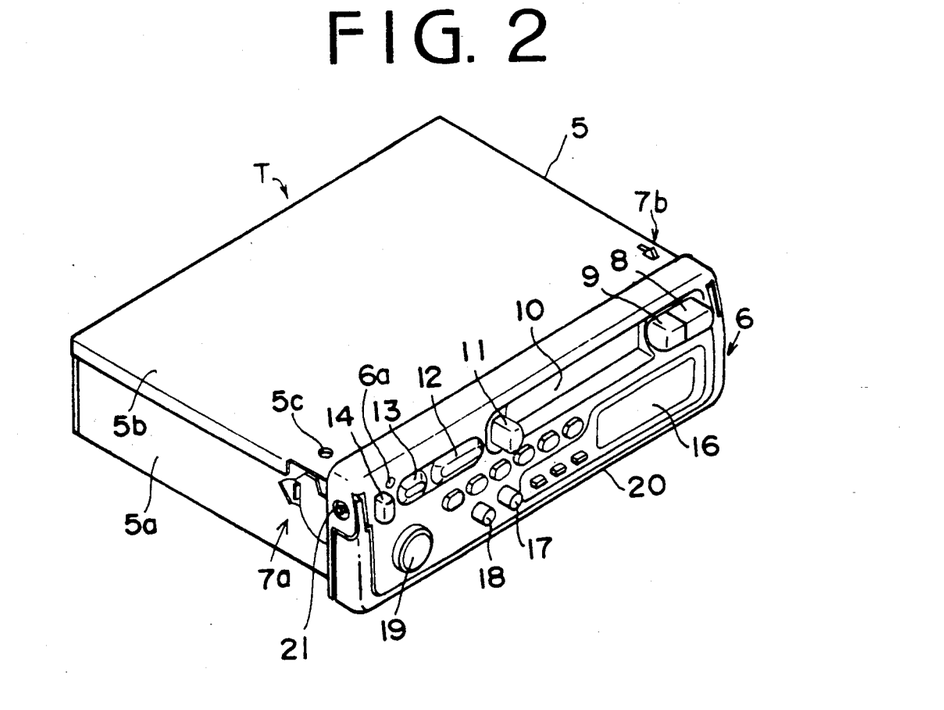

FIGS. 1 and 2 show a radio cassette T detachably mounted in a dashboard of a motor vehicle for reproducing the sound recorded in a cassette tape.

The radio cassette T comprises a housing 5, an operation panel 6 secured to the front portion of the housing 5, and a handle 20 having a flat U-shape and pivotally mounted on the housing 5. The housing 5 comprises a pair of side plates 5a, 5a', a cover plate 5b, a bottom plate 5e (FIG. 3), and a rear plate (not shown). The operation panel 6 has a front panel 6b on which various push buttons and knobs to be manually operable for reproducing the tape are provided. The front panel 6b has an upper flange 6c integral with the front panel, and opposite side flanges 6d downwardly projected from the upper flange 6c. Thus, the outer edges of the cover plate 5b and the side plates 5a, 5a' are covered with the flanges 6c and 6d.

On an upper portion of the front panel 6b, FF and REW pushbuttons 8 and 9 are provided side by side. An elongated opening 10 of a cassette holder having a cover is provided next to the pushbutton 9. An ejection pushbutton 11 is provided adjacent the opening 10 for ejecting the cassette tape from the cassette holder. A tuning set button 12 and a frequency band width set button 13 are provided for setting the tuning and the frequency band width. Each of the buttons 12 and 13 is operated by pushing the button. On the lower portion, a liquid crystal display 16, tone control knobs 17 and 18, and a volume control knob 19 are provided.

In the present invention, the operation panel 6 has a release pushbutton 14 provided on the upper portion of the front panel 6b for releasing the lock of the handle 20, which will be described hereinafter. The release pushbutton 14 has approximately the same appearance as the other pushbuttons 8, 9 and 11 and is made of resin which is the same as the other pushbuttons.

The U-shaped handle 20 has a shape corresponding to the lower peripheral contour of the operation panel 6 so that when the handle 20 is set on the operation panel 6, the front surface of the handle 20 becomes flush with the front panel 6b as shown in FIG. 2. The handle is coated with the resin which is the same as pushbuttons 11 to 13. Therefore, a uniform appearance is provided.

Figure 3:
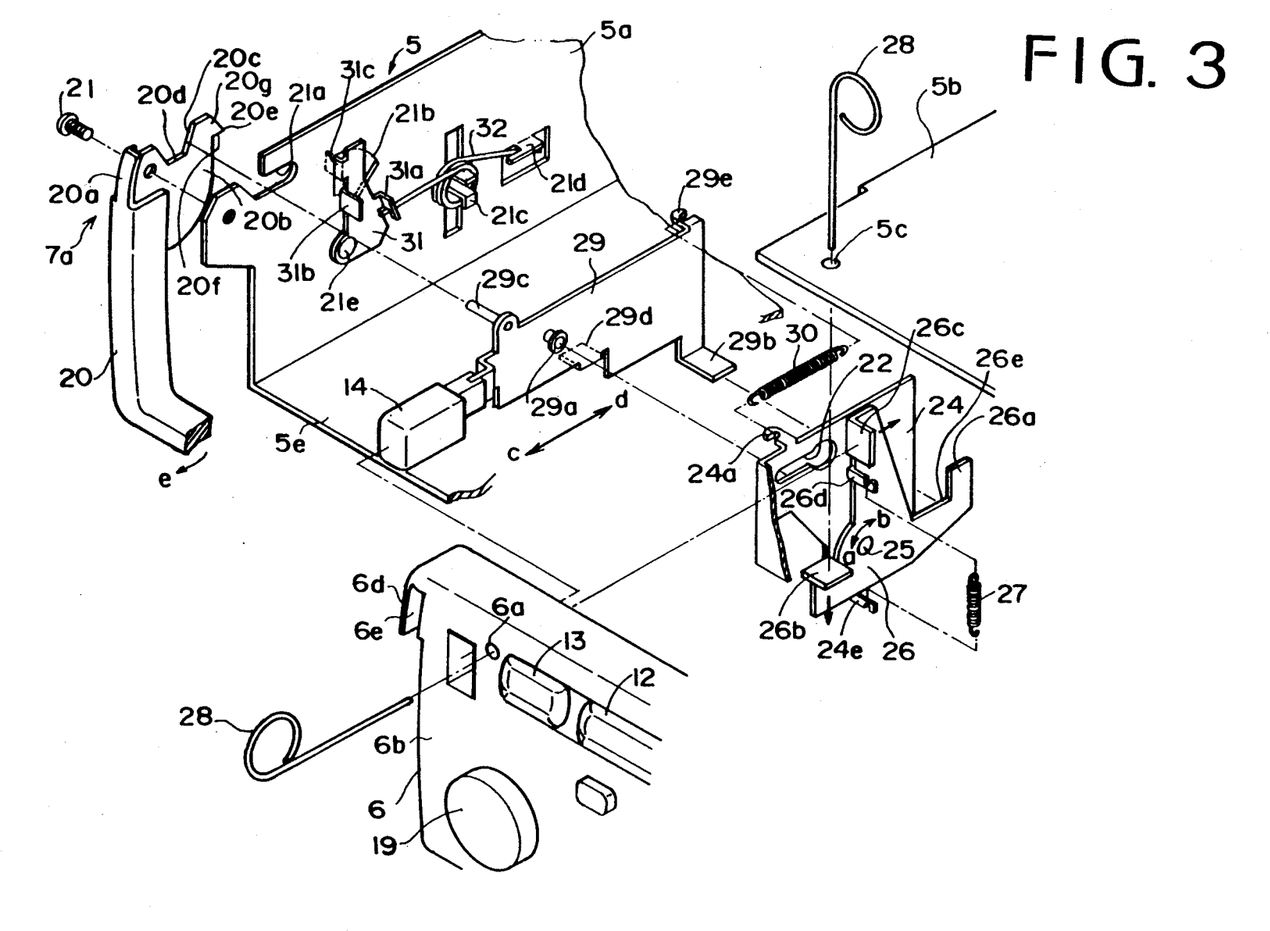
FIG. 3 is an exploded perspective view showing a first lock mechanism for the handle.
Figure 4:
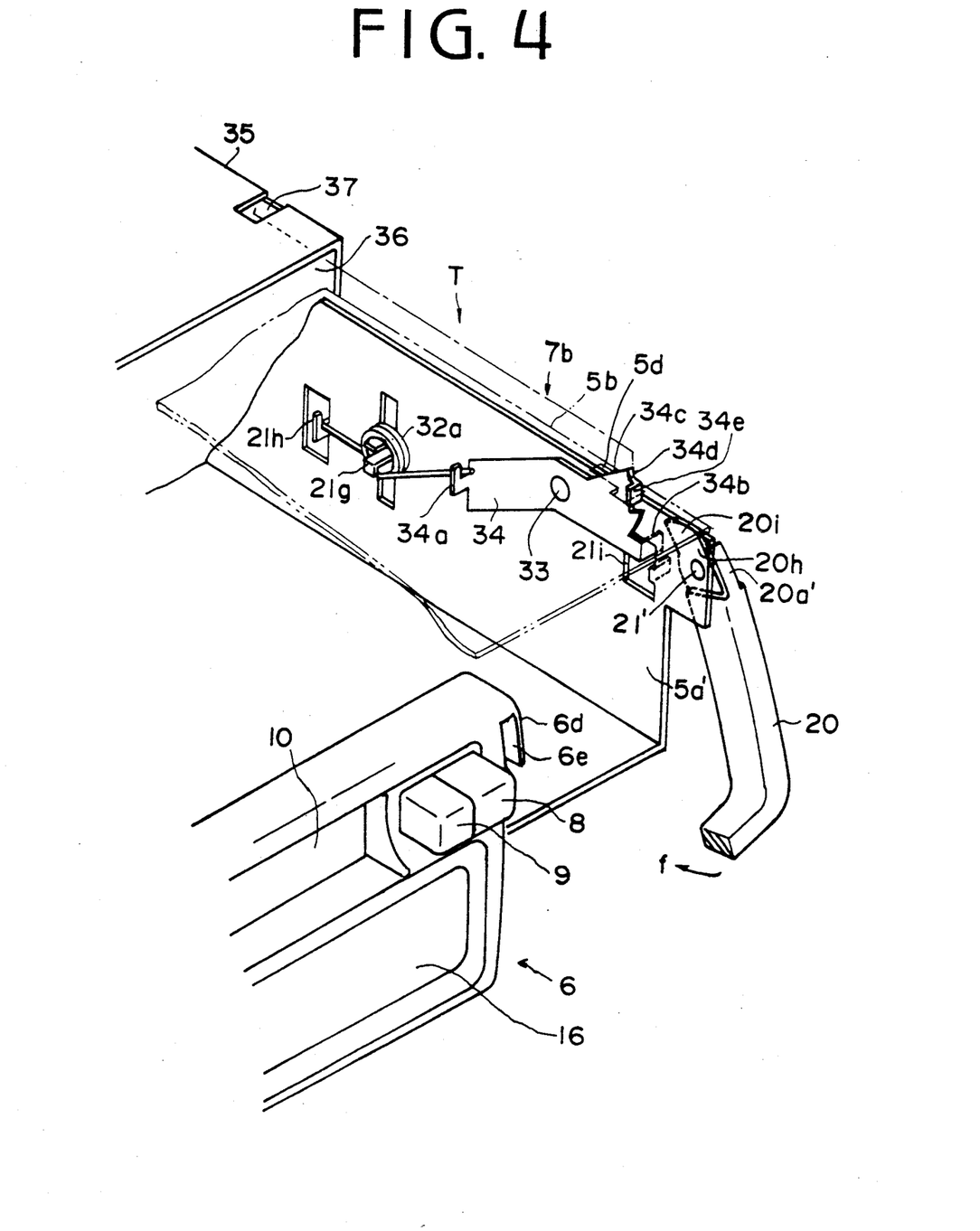
FIG. 4 is an exploded perspective view showing a second lock mechanism for the handle.

The handle 20 has first and second lock mechanisms 7a and 7b provided on the side plates 5a and 5a', respectively, at a front portion of the housing 5. FIG. 3 shows the first lock mechanism 7a for locking the handle 20 to the radio cassette T. FIG. 4 shows the second lock mechanism 7b for locking the radio cassette T to a holder 35 provided in the dashboard.

Referring to FIG. 3, the handle 20 is provided with an engaging plate 20b secured to an end 20a thereof. To the other end 20a' of the handle 20' an engaging plate 20g is secured as shown in FIG. 4. The handle is rotatably mounted on the side plate 5a by a screw 21 at the engaging plate 20b. Thus, the engaging plate 20b is rearwardly extended from the screw 21 as a pivot. The engaging plate 20b has a recess 20d having a slant 20c, and an engaging projection 20g having a bevel 20e and hook 20f.

Formed in the side plate 5a are an engaging groove 21a, a sector-shaped hole 21b, a projection 21c for attaching a coil spring 32, and a projection 21d for connecting an end of the spring 32.

A first lock lever 31 is pivotally mounted on the inside of the side plate 5a adjacent to the sector-shaped hole 21b by a pin 21e. The first lock lever 31 has a projection 31a, an engaging lug 31b having a vertical plane, and an engaging lug 31c outwardly projected from the sector-shaped hole 21b. The other end of the spring 32 is connected to the projection 31a to urge the lock lever 31 in the counterclockwise direction by the elastic force of the spring 32. Thus, the engaging lug 31c is abutted on the edge of the hole 21b so as to be engaged with the engaging projection 20g of the engaging plate 20b. In accordance with the operation of the handle 20, the engaging lug 31c is adapted to engage either with the bevel 20e at the lower edge thereof or with the hook 20f at the upper edge thereof.

A support plate 24 is securely mounted on the bottom plate 5e. The support plate 24 has an elongated hole 22, a first hook 24a, and a second hook 24e.

A second lock lever 26 is pivotally mounted on the support plate 24 by a pin 25. The second lock lever 26 has an arm 26a defining a recess 26e, a lock lug 26b having a horizontal plane, a release lug 26c having a vertical plane, and a hook 26d. The horizontal plane and the vertical plane of the lugs 26b and 26c are disposed at 90 degrees. A tension spring 27 is provided between the hook 26d and the hook 24e to urge the lock lever 26 in the direction shown by arrow a in the locked position and in the direction shown by an arrow b in the unlocked position.

A slide plate 29 is slidably provided between the support plate 24 and the side plate 5a. The slide plate 2a has, at one side, an engaging pin 29a slidably engaged with the hole 22 of the support plate 24, and an engaging lug 29b engaged with the recess 26e of the arm 26a of the lock lever 26. The slide plate 29 is further provided with, at the other side, a pin 29c slidably engaged with the groove 21a of the side plate 5a, a lug 29d engaged with the engaging lug 31b of the first lock lever 31, and a hook 29e. The pin 29c is projected to the engaging plate 20b so as to slide on the recess 20d of the engaging plate 20b. A tension spring 30 is provided between the hook 29e and the hook 24a of the plate 24 to urge the slide plate 29 in the direction shown by an arrow c.

The release pushbutton 14 slidably mounted on the operation panel 6 is secured to the slide plate 29 at the front portion of the plate. When the pushbutton 14 is pushed, the slide plate 29 is slid in the direction shown by an arrow d. At that time, the lug 29d is adapted to push the vertical plane of the engaging lug 31b and the pin 29c pushes the slant 20c.

In order to operate the second lock lever 26 to lock or unlock the slide plate 29, a tool 28 is provided for pushing the lock lug 26b or the release lug 26c passing through a hole 5c formed in the cover plate 5b or a hole 6a formed in the front panel 6b.

Describing the second lock mechanism 7b with reference to FIG. 4, the engaging plate 20h of the handle 20 is rotatably mounted on the side plate 5a' by a screw 21'. The engaging plate 20h has an engaging projection 20i.

Provided on the side plate 5a' are a projection 21g for attaching a coil spring 32a, a projection 21h to be engaged with an end of the spring 32a, and a rectangular hole 21i.

A third lock lever 34 is pivotally mounted on the side plate 5a' by a pin 33. The third lock lever 34 has a projection 34a engaged with the other end of the coil spring 32a, an engaging lug 34b projected from the hole 21i, and an engaging projection 34d projected from an opening 5d formed in the cover plate 5b. The engaging projection 34d has a bevel 34c and an engaging lug 34e. By the spring 32a, the lock lever 34 is urged in the counterclockwise direction so that the engaging lug 34b is adapted to be engaged with the engaging projection 20i of the engaging plate 20h at an upper edge thereof.

The radio cassette T is inserted in the holder 35 passing through an opening 36. The holder 35 has a hole 37 formed in an upper plate thereof.

Each of the engaging plates 20b and 20h secured to the handle 20 is adapted to be inserted into a slit 6e between the front panel 6b and the side flange 6d.

Figure 5:
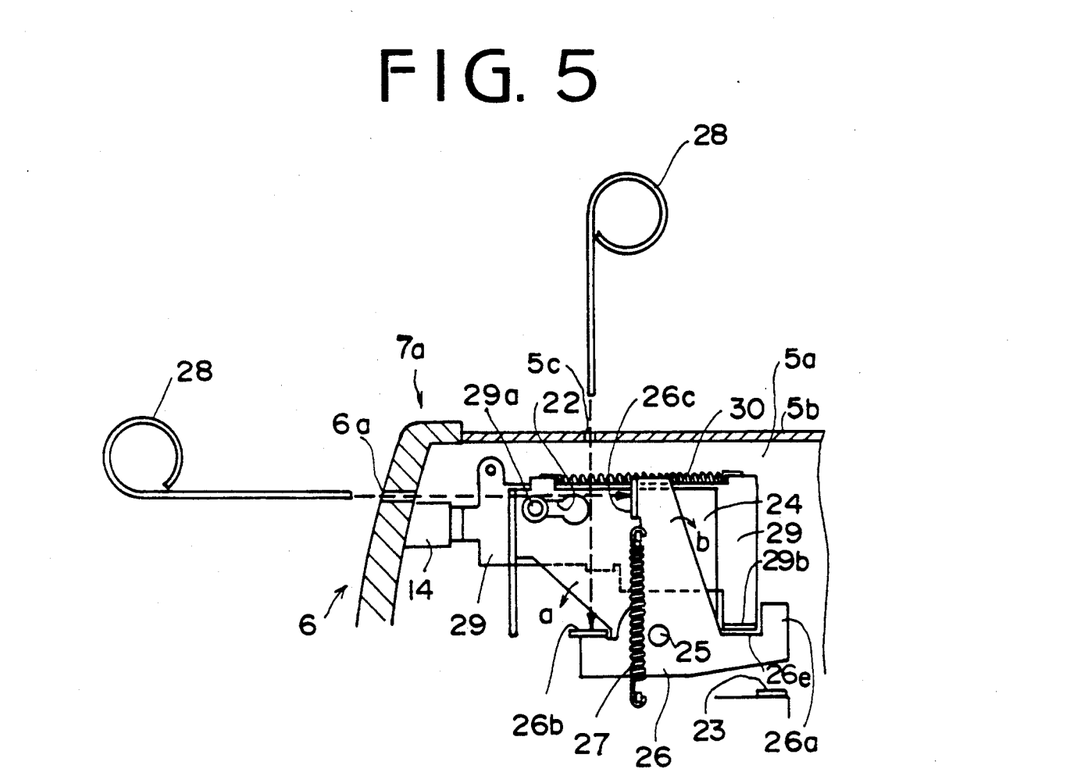
FIG. 5 is a sectional view partly showing the first lock mechanism.
Figure 6:
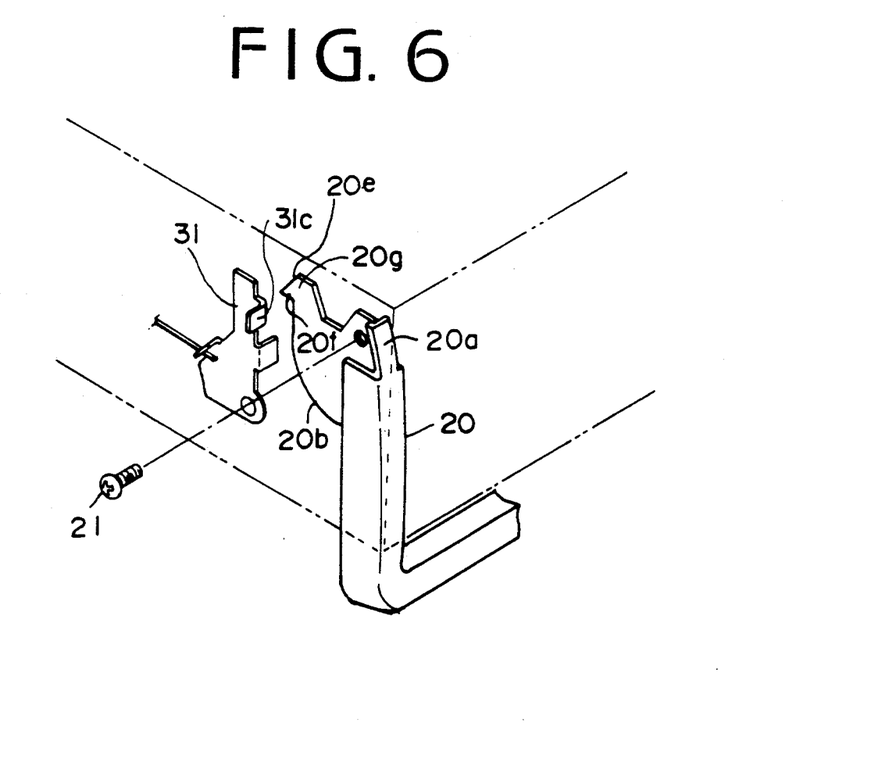
FIG. 6 is an exploded perspective view showing a part of the first lock mechanism.

Describing the operation of the lock mechanisms 7a and 7b, the radio cassette T is usually mounted in the holder 35. In the locked condition, the engaging lug 29b is engaged with the recess 26e of the arm 26a of the second lock lever 26 as shown in FIG. 5. Consequently, even if the pushbutton 14 is pushed, the slide plate 29 is prevented from moving, so that the lock of the handle 20 can not be released.

In order to release the second lock lever 26, the tool 28 is inserted into the hole 6a of the front panel 6b to rearwardly push the release lug 26c of the lock lever 26. Thus, the lock lever 26 is rotated about the pin 25 in the direction b against the force of the spring 27 over a neutral point so that the recess 26e is disengaged from the engaging lug 29b. Then, the release pushbutton 14 is pushed. The slide plate 29 moves in the direction a (FIG. 3). As the slide plate 29 is moving, the lug 29d pushes the engaging lug 31b of the first lock lever 31 to cause the lock lever 31 to rotate about the pin 21e in the clockwise direction against the force of the spring 32. Thus, the lug 31c is disengaged from the hook 20f of the engaging plate 20b.

When the release pushbutton 14 is further pushed, the pin 29c of the slide plate 29 slides in the groove 21a to push the slant 20c of the recess 20d to rotate the engaging plate 20b about the screw 21 in the clockwise direction. Thus, the handle 20 is rotated in the direction e shown in FIG. 3 to be slightly projected from the operation panel 6. Then, the handle 20 can be upwardly rotated by the hand of the user to the horizontal position.

On the other hand, in the second lock mechanism 7b, when the radio cassette T is mounted in the holder 35, the engaging projection 34d of the third lock lever 34 is engaged with the hole 37 of the holder 35. When the handle 20 is upwardly rotated, the engaging projection 20i of the engaging plate 20h is downwardly rotated to push down the engaging lug 34b. Thus, the lock lever 34 is rotated in the clockwise direction about the pin 33 so that the engaging lug 34d is disengaged from the hole 37. The handle 20 can be pulled by the user's hand to take out the radio cassette T from the holder 35.

When the radio cassette is taken T out from the holder 35, the second lock lever 26 is kept in released position by the spring 27. Therefore, it is necessary to return the lock lever 26 to the position of FIG. 5.

To this end, the tool 28 is inserted into the hole 5c of the cover plate 5b to push down the lug 26b of the second lock lever 26 so that the lock lever 26 is rotated in the direction a against the elastic force of the spring 27 over the neutral point. The recess 26e engages with the engaging lug 29b to lock the slide plate 29 as shown in FIG. 5.

The radio cassette T is inserted in the holder 35 passing through the opening 36. Even if the engaging projection 34d contacts with the edge of the opening 36, the third lock lever 34 is pivoted by the bevel 34c, and the engaging projection 34d passes the edge. Thus, the radio cassette T can be smoothly inserted into the holder 35. When the radio cassette T is completely mounted in the holder 35, the handle 20 is pushed down in the direction shown by an arrow f of FIG. 4 to the receiving position. The projection 20i of the engaging plate 20g is disengaged from the lug 34b, so that the lever 34 is pivoted by the spring 32a. Thus, the engaging projection 34d is projected from the hole 37 and engages with the edge of the hole 37 to lock the radio cassette T.

On the other hand, in the first lock mechanism 7a, the bevel 20e of the engaging projection 20g abuts on the lug 31c and pivots the first lock lever 31 against the force of the spring 32 as shown in FIG. 1. When the bevel 20e passes the lug 31c, the lock lever 31 is returned by the spring 32 so that the lug 31c engages with the hook 20f with a click. Thus, the handle 20 is locked by the first lock mechanism 7a.

Figure 7:
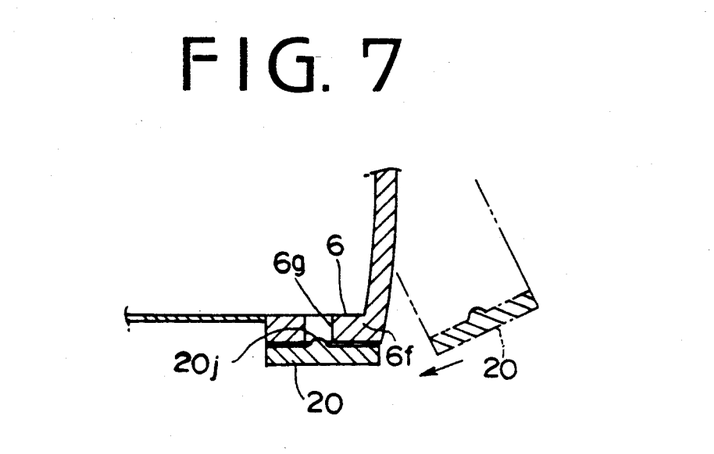
FIG. 7 is a sectional view showing a modification of the handle.

FIG. 7 shows a modification of the lock mechanism. A lower flange 6f of the front panel 6b has a recess 6g. The handle 20 has a projection 20j corresponding to the recess 6g.

When the handle 20 is in the receiving position, the projection 20j engages with the recess 6g. Since the lower portion of the handle 20 is fixed by these elements, the locking of the handle 20 is ensured.

In accordance with the present invention, when the handle is locked in the receiving position, the engaging lug of the first lock lever is engaged with the hook of the engaging plate with a click. The lock mechanism of the handle is released by pushing the release pushbutton. When the pushbutton is pushed, the engaging plate is disengaged from the lock lever, so that the handle is slightly pivoted to project from the radio cassette in accordance. Thus, the handle can be easily gripped by hand for pulling out the radio cassette from the holder without using fingernails.

Furthermore, in the present invention, the tool is provided for locking the release pushbutton. If the second lock lever is locked by the tool before the radio cassette is mounted in the holder, the pushbutton can not be pushed. The radio cassette is locked in the holder by the third lock lever.

While the presently preferred embodiment of the present invention has been shown and described, it is to be understood that this disclosure is for the purpose modifications may be made without departing from the scope of the invention as set forth in the appended claims.

What is claimed is:

1. A handle device for an audio equipment provided in a housing comprising:
   a holder in which the housing is to be inserted;
   a handle having a flat U-shape and pivotally mounted on the housing;
   an engaging plate provided on the handle and having a hook;
   a first lock lever pivotally mounted on the housing and having an engaging lug provided to be engaged with the hook of the engaging plate;
   a spring provided to urge the first lock lever so as to engage the engaging lug with the hook to lock the handle;
   a slide plate slidably mounted in the housing and having a lug to be engaged with the first lock lever;
   a pushbutton fixed to the slide plate for pushing the slide plate, whereby engaging the lug with the first lock lever to rotate it so as to release the engaging lug from the hook.

2. The handle device according to claim 1 further comprising a second lock lever which is pivoted by a tool for locking and releasing the slide plate.

3. The handle device according to claim 2 further comprising a spring for keeping the second lock lever at a lock position and at a release position.

4. A handle device for an audio equipment provided in a housing comprising:
   a holder in which the housing is to be inserted;
   a handle having a flat U-shape and pivotally mounted on the housing;
   first lock means for locking the handle at a retracted position;
   releasing means manually operated for releasing the first lock means;
   second lock means provided for locking the housing in the holder and provided to be operated by rotating the handle to a projected position, thereby releasing the lock of the housing wherein the second lock means comprises a third lock lever having a projection to be engaged with a hole of the holder for locking the housing in the holder.

5. A handle device for an audio equipment provided in a housing comprising:
   a holder in which the housing is to be inserted;
   a handle having a flat U-shape and pivotally mounted on the housing;
   first lock means for locking the handle at a retracted position;
   releasing means manually operated for releasing the first lock means;
   second lock means provided for locking the housing in the holder and provided to be operated by rotating the handle to a projected position, thereby releasing the lock of the housing wherein the first lock means comprises:
   an engaging plate provided on the handle and having a hook, a first lock lever pivotally mounted on the housing and having an engaging lug provided to be engaged with the hook of the engaging plate, and a spring provided to urge the first lock lever so as to engage the engaging lug with the hook to lock the handle,
   the releasing means comprises:
   a slide plate slidably mounted in the housing and having a lug to be engaged with the first lock lever; and a pushbutton fixed to the slide plate for pushing the slide plate, whereby engaging the lug with the first lock lever to rotate it so as to release the engaging lug from the hook.

6. The handle device according to claim 5 further comprising a second lock lever which is pivoted by a tool for locking and releasing the slide plate.

7. A handle device for an audio equipment having a front panel and provided in a housing comprising :
   a handle having a flat U-shape and pivotally mounted on the housing;
   an engaging plate provided on the handle at a rear side portion of the pivot of the handle, and having a slant;
   a slide plate slidably mounted in the housing and having a pin to slide on the slant of the engaging plate;
   a pushbutton fixed to the slide plate for pushing the slide plate, whereby sliding the pin on the slant to rotate the handle at a small angle so as to project it from the housing.

8. The handle device according to claim 7 wherein the handle has a shape corresponding to a contour of a lower periphery of the front panel,
   the handle and the pushbutton are made of the same material as operating pushbuttons of the front panel.

9. The handle device according to the claim 7 wherein a front surface of the handle at a retracted position is flush with the surface of the front panel.

* * * * *